US009240491B2

(12) United States Patent
Ito et al.

(10) Patent No.: US 9,240,491 B2
(45) Date of Patent: Jan. 19, 2016

(54) SEMICONDUCTOR DEVICE AND METHOD FOR MANUFACTURING SAME

(75) Inventors: Kazuatsu Ito, Osaka (JP); Hidehito Kitakado, Osaka (JP)

(73) Assignee: SHARP KABUSHIKI KAISHA, Osaka (JP)

(*) Notice: Subject to any disclaimer, the term of this patent is extended or adjusted under 35 U.S.C. 154(b) by 0 days.

(21) Appl. No.: 14/130,844

(22) PCT Filed: Jun. 26, 2012

(86) PCT No.: PCT/JP2012/066215
§ 371 (c)(1),
(2), (4) Date: Jan. 23, 2014

(87) PCT Pub. No.: WO2013/005604
PCT Pub. Date: Jan. 10, 2013

(65) Prior Publication Data
US 2014/0138678 A1 May 22, 2014

(30) Foreign Application Priority Data
Jul. 7, 2011 (JP) ................................. 2011-150785

(51) Int. Cl.
*H01L 29/10* (2006.01)
*H01L 29/66* (2006.01)
*H01L 27/12* (2006.01)
*H01L 29/786* (2006.01)

(52) U.S. Cl.
CPC ........ *H01L 29/7869* (2013.01); *H01L 27/1225* (2013.01); *H01L 29/66969* (2013.01); *H01L 29/78618* (2013.01); *H01L 29/78645* (2013.01); *H01L 29/78696* (2013.01)

(58) Field of Classification Search
CPC ............... H01L 29/7869; H01L 29/78696; H01L 21/02554; H01L 21/02565; H01L 27/1225
USPC ..................... 257/43; 438/104, 158
See application file for complete search history.

(56) References Cited

U.S. PATENT DOCUMENTS

| 6,235,558 B1 | 5/2001 | Oda et al. | |
| 6,518,594 B1 * | 2/2003 | Nakajima et al. | 257/59 |
| 2002/0016028 A1 * | 2/2002 | Arao et al. | 438/149 |

(Continued)

FOREIGN PATENT DOCUMENTS

| JP | 2000-294787 A | 10/2000 |
| JP | 2003-257989 A | 9/2003 |

(Continued)

*Primary Examiner* — Julio J Maldonado
*Assistant Examiner* — Moazzam Hossain
(74) *Attorney, Agent, or Firm* — Chen Yoshimura LLP

(57) ABSTRACT

A semiconductor device (100A) has an oxide semiconductor layer (11). The oxide semiconductor layer (11) has a channel region (11c), and a source region (11s) and drain region (11d) positioned on respective sides of the channel region (11c). The source region (11s) has a low-resistance source region (11sx) that has a lower resistance than the channel region (11c), and the drain region (11d) has a low-resistance drain region (11dx) that has a lower resistance than the channel region (11c). The carrier concentrations of the low-resistance source region (11sx) and the low-resistance drain region (11dx) become progressively lower from a connecting portion between a source electrode (17) and the low-resistance source region (11sx) and a connecting portion between a drain electrode (18) and the low-resistance drain region (11dx) towards the channel region (11c).

9 Claims, 11 Drawing Sheets

(56) References Cited

U.S. PATENT DOCUMENTS

| | | |
|---|---|---|
| 2006/0214239 A1* | 9/2006 | Shimada ........................ 257/401 |
| 2009/0283763 A1 | 11/2009 | Park et al. |
| 2009/0295699 A1* | 12/2009 | Korenari et al. ................. 345/92 |
| 2010/0133531 A1 | 6/2010 | Akimoto et al. |
| 2010/0224873 A1 | 9/2010 | Sakata et al. |
| 2011/0042670 A1 | 2/2011 | Sato et al. |
| 2011/0254538 A1* | 10/2011 | Kato et al. ................. 324/76.11 |

FOREIGN PATENT DOCUMENTS

| | | |
|---|---|---|
| JP | 2005-072531 A | 3/2005 |
| JP | 2009-272427 A | 11/2009 |
| JP | 2009-278115 A | 11/2009 |
| JP | 2010-157702 A | 7/2010 |
| JP | 2010-232647 A | 10/2010 |

* cited by examiner (a)

(b)

(a)

(b)

(c)

(a)

(b)

(a)

(b)

(c)

(d)

(a)

(b)

(c)

(a)

(b)

(c)

(d)

(a)

(b)

(a)

(b)

(a)

(b)

(c)

(d)

(a)

(b)

(c)

SEMICONDUCTOR DEVICE AND METHOD FOR MANUFACTURING SAME

TECHNICAL FIELD

The present invention relates to a semiconductor device formed using an oxide semiconductor, and to a method of manufacturing the semiconductor device.

BACKGROUND ART

An active matrix substrate used in liquid crystal display devices and the like has a switching element such as a thin-film transistor (hereinafter, "TFT") in each pixel. Conventionally, a TFT with an amorphous silicon film as an active layer (hereinafter, "amorphous silicon TFT") or a TFT with a polycrystalline silicon film as an active layer (hereinafter, "polycrystalline silicon TFT") has been widely used as such a switching element.

The use of an oxide semiconductor as the material of the TFT active layer, instead of amorphous silicon or polycrystalline silicon, has been recently proposed. Such a TFT is referred to as an "oxide semiconductor TFT." Oxide semiconductors have a higher mobility than amorphous silicon. Therefore, the oxide semiconductor TFT can operate at a faster speed than the amorphous silicon TFT. Furthermore, the oxide semiconductor film is formed with a process that is simpler than for the polycrystalline silicon film, and thus, the oxide semiconductor film can be applied to devices requiring a large area.

An oxide semiconductor TFT with a top-gate structure is disclosed in Patent Document 1. The oxide semiconductor TFT disclosed in Patent Document 1 undergoes plasma treatment to form a source/drain region on the oxide semiconductor layer thereof.

RELATED ART DOCUMENTS

Patent Documents

Patent Document 1: Japanese Patent Application Laid-Open Publication No. 2009-278115
Patent Document 2: Japanese Patent Application Laid-Open Publication No. 2010-232647

SUMMARY OF THE INVENTION

Problems to be Solved by the Invention

However, with the oxide semiconductor TFT disclosed in Patent Document 1, plasma treatment (hydrogen plasma treatment, for example) must be performed after the gate insulating film has been etched, and thus, there is a problem of having many manufacturing steps.

The present invention was made in view of the above situation and aims at providing a method of manufacturing an oxide semiconductor TFT that has fewer manufacturing steps than the method of manufacturing the oxide semiconductor TFT disclosed in Patent Document 1, and an oxide semiconductor TFT that can be obtained by such a method of manufacturing.

Means for Solving the Problems

A semiconductor device according to the present invention includes a substrate; and a thin-film transistor supported by the substrate, wherein the thin-film transistor includes: an oxide semiconductor layer that has a first channel region, and a source region and a drain region positioned on respective sides of the first channel region; a gate insulating film, a source electrode, and a drain electrode formed above the oxide semiconductor layer; and a first gate electrode that is formed above the gate insulating film and that is arranged so as to overlap the first channel region, wherein the source region has a low-resistance source region that has a smaller resistance than the first channel region when a gate voltage is not being applied to the first gate electrode, wherein the drain region has a low-resistance drain region that has a smaller resistance than the first channel region when a gate voltage is not being applied to the first gate electrode, wherein the low-resistance source region connects to the source electrode, and the low-resistance drain region connects to the drain electrode, and wherein carrier concentrations of the low-resistance source region and the low-resistance drain region become progressively lower from a connecting portion of the source electrode and the low-resistance source region and a connecting portion of the drain electrode and the low-resistance drain region towards the first channel region.

In one embodiment of the present invention, at least an end of the low-resistance source region or an end of the low-resistance drain region overlaps an end of the first gate electrode when viewed from a direction normal to the substrate.

In one embodiment of the present invention, at least a portion of the low-resistance source region or a portion of the low-resistance drain region overlaps the first gate electrode through the gate insulating film when viewed from a direction normal to the substrate.

In one embodiment of the present invention, at least a distance from an end of the first gate electrode to an end of the low-resistance source region or a distance from an end of the first gate electrode to an end of the low-resistance drain region is 0.2 μm to 2 μm.

In one embodiment of the present invention, carrier concentrations of an end portion of the low-resistance source region and the low-resistance drain region on the first channel region side are $10^{18}$ cm$^{-3}$ to $10^{20}$ cm$^{-3}$.

In one embodiment of the present invention, the source electrode connects to the low-resistance source region in a first contact hole formed in the gate insulating film, the drain electrode connects to the low-resistance drain region in a second contact hole formed in the gate insulating film, and a distance from the first contact hole to the first gate electrode is equal to a distance from the second contact hole to the first gate electrode.

In one embodiment of the present invention, the thin-film transistor further includes: a middle semiconductor region positioned between the source region and the drain region, and a second channel region positioned between the middle semiconductor region and the drain region, each formed in the oxide semiconductor layer; a second gate electrode that is formed above the gate insulating film and that is arranged so as to overlap the second channel region; and a middle electrode formed above the oxide semiconductor layer, wherein the middle semiconductor region has a low-resistance middle region that has a smaller resistance than the first channel region and the second channel region when a gate voltage is not being applied to the first gate electrode and the second gate electrode, wherein the low-resistance middle region connects to the middle electrode, and wherein a carrier concentration of the low-resistance middle region becomes progressively lower from a connecting portion of the low-resistance middle region and the middle electrode towards the first channel region, and progressively lower from a connecting portion of the low-resistance middle region and the middle electrode towards the second channel region.

In one embodiment of the present invention, at least an end of the low-resistance source region or an end of the low-resistance middle region overlaps an end of the first gate electrode, or, at least an end of the low-resistance middle region or an end of the low-resistance drain region overlaps an end of the second gate electrode when viewed from a direction normal to the substrate.

In one embodiment of the present invention, at least a portion of the low-resistance source region or a portion of the low-resistance middle region overlaps the first gate electrode through the gate insulating film, or, at least a portion of the low-resistance drain region or a portion of the low-resistance middle region overlaps the second gate electrode through the gate insulating film when viewed from a direction normal to the substrate.

In one embodiment of the present invention, at least the portion of the low-resistance source region or the portion of the low-resistance middle region overlaps the first gate electrode through the gate insulating film, and, at least the portion of the low-resistance drain region or the portion of the low-resistance middle region overlaps the second gate electrode through the gate insulating film.

In one embodiment of the present invention, at least a distance from an end of the first gate electrode to an end of the low-resistance middle region or a distance from an end of the second gate electrode to an end of the low-resistance middle region is 0.2 μm to 2 μm.

In one embodiment of the present invention, a carrier concentration of an end portion of the low-resistance middle region on the first channel region side and a carrier concentration of an end portion of the low-resistance middle region on the second channel region side are each $10^{18}$ cm$^{-3}$ to $10^{20}$ cm$^{-3}$.

In one embodiment of the present invention, the middle electrode connects to the middle semiconductor region in a third contact hole formed in the gate insulating film, a distance from the first gate electrode to the first contact hole, a distance from the first gate electrode to the third contact hole, a distance from the second gate electrode to the third contact hole, and a distance from the second gate electrode to the second contact hole are equal.

In one embodiment of the present invention, at least one of the low-resistance source region, the low-resistance drain region, or the low-resistance middle region reaches a vicinity of a boundary of the oxide semiconductor layer on the substrate side.

In one embodiment of the present invention, the oxide semiconductor layer includes an In—Ga—Zn—O semiconductor.

A method of manufacturing a semiconductor device according to the present invention includes: (A) forming an oxide semiconductor layer above a substrate; (B) forming a gate insulating film above the oxide semiconductor layer; (C) forming a first gate electrode above the gate insulating film; (D) forming a source electrode and a drain electrode that is electrically separated from the source electrode above the oxide semiconductor layer; (E) providing hydrogen to the source electrode and the drain electrode; and (F) forming, by annealing, a low-resistance source region adjacent to the source electrode by diffusing the hydrogen contained in the source electrode to the oxide semiconductor layer and forming a low-resistance drain region adjacent to the drain electrode by diffusing the hydrogen contained in the drain electrode to the oxide semiconductor layer.

In one embodiment of the present invention, the step (C) includes a step (C1) of forming a contact hole in the gate insulating film, and the step (C1) includes forming the first gate electrode and the contact hole by halftone exposure.

In one embodiment of the present invention, the step (C) includes a step (C2) of forming a second gate electrode above the substrate, the step (D) includes a step (D1) of forming a middle electrode between the first gate electrode and the second gate electrode, the step (E) includes a step (E1) of providing hydrogen to the middle electrode, and the step (F) includes a step (F1) of forming a low-resistance middle region adjacent to the middle electrode by diffusing the hydrogen contained in the electrode to the oxide semiconductor layer.

In one embodiment of the present invention, oxide semiconductor layer includes an In—Ga—Zn—O semiconductor.

In one embodiment of the present invention, a temperature while performing annealing is 250° C. to 400° C.

A method of manufacturing a semiconductor device according to another embodiment of the present invention includes (A) forming an oxide semiconductor layer above a substrate; (B) forming a gate insulating film above the oxide semiconductor layer; (C) forming a first gate electrode above the gate insulating film; (D) forming a source electrode and a drain electrode that is electrically separated from the source electrode above the oxide semiconductor layer; (E) forming a protective film containing hydrogen above the source electrode and the drain electrode; and (F) forming, by annealing, a low-resistance source region adjacent to the source electrode and forming a low-resistance drain region adjacent to the drain electrode by passing the hydrogen contained in the protective film through the source electrode or the drain electrode and diffusing the hydrogen to the oxide semiconductor layer.

Effects of the Invention

According to one embodiment of the present invention, a method of manufacturing an oxide semiconductor TFT that has fewer manufacturing steps than the method of manufacturing the oxide semiconductor TFT disclosed in Patent Document 1, and an oxide semiconductor TFT that can be obtained by such a method of manufacturing, are provided.

DETAILED DESCRIPTION OF EMBODIMENTS

Below, an embodiment of a semiconductor device of the present invention will be explained with reference to drawings. The semiconductor device of the present embodiment is provided with a thin-film transistor (oxide semiconductor TFT) that has an active layer made of an oxide semiconductor. The semiconductor device of the present embodiment may be provided with an oxide semiconductor TFT, and includes a wide range of active matrix substrates, various types of display devices, electronic devices, and the like.

A TFT substrate having an oxide semiconductor TFT as a switching element will be explained as an example. The TFT substrate of the present embodiment can be suitably used in a liquid crystal display device.

Figure 1:
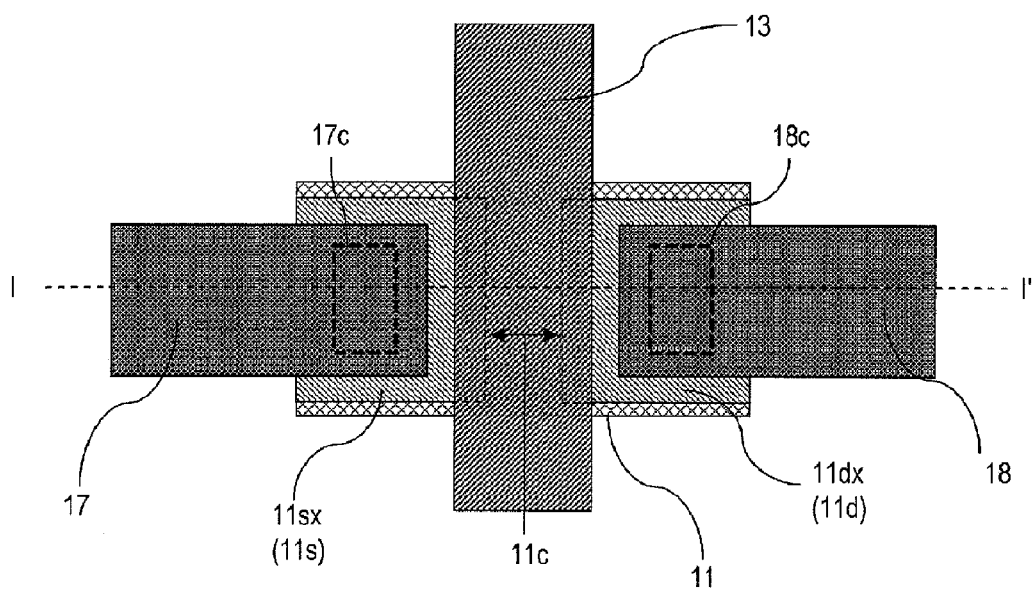
FIG. 1(a) is a plan view schematically showing a semiconductor device 100A of one embodiment of the present invention.
FIG. 1(b) is a cross-sectional view schematically showing the semiconductor device 100A in FIG. 1(a) along the line I-I'.
Figure 1:
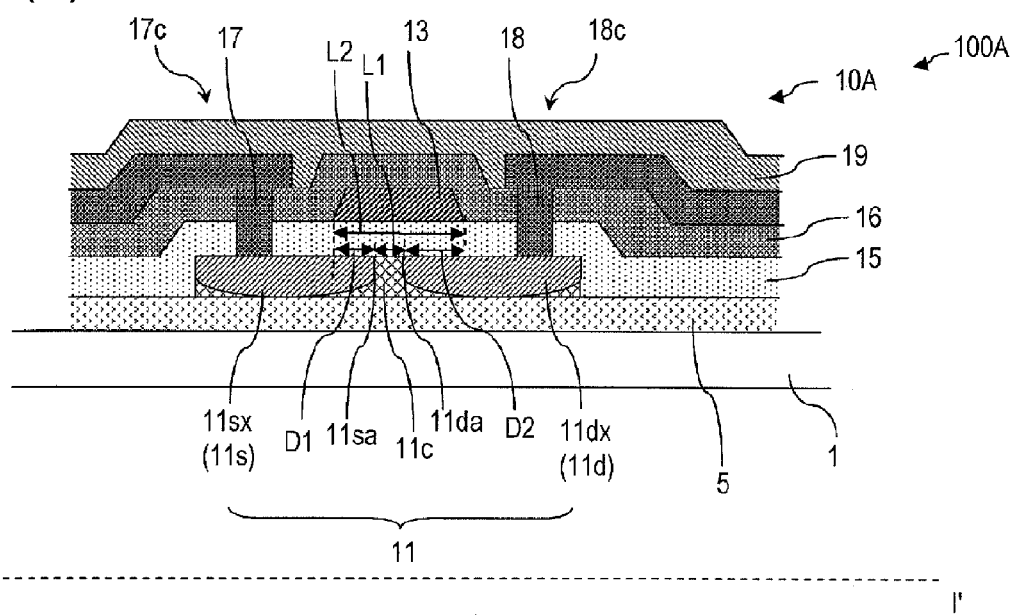
Figure 3:
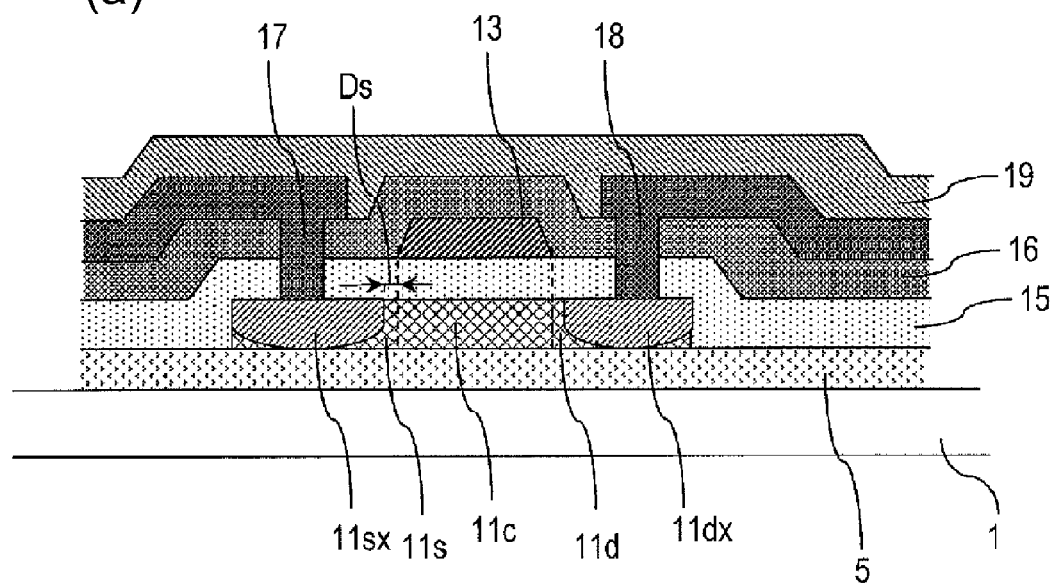
FIGS. 3(a) and 3(b) are respectively cross-sectional views schematically showing modification examples of the semiconductor device 100A.
Figure 3:
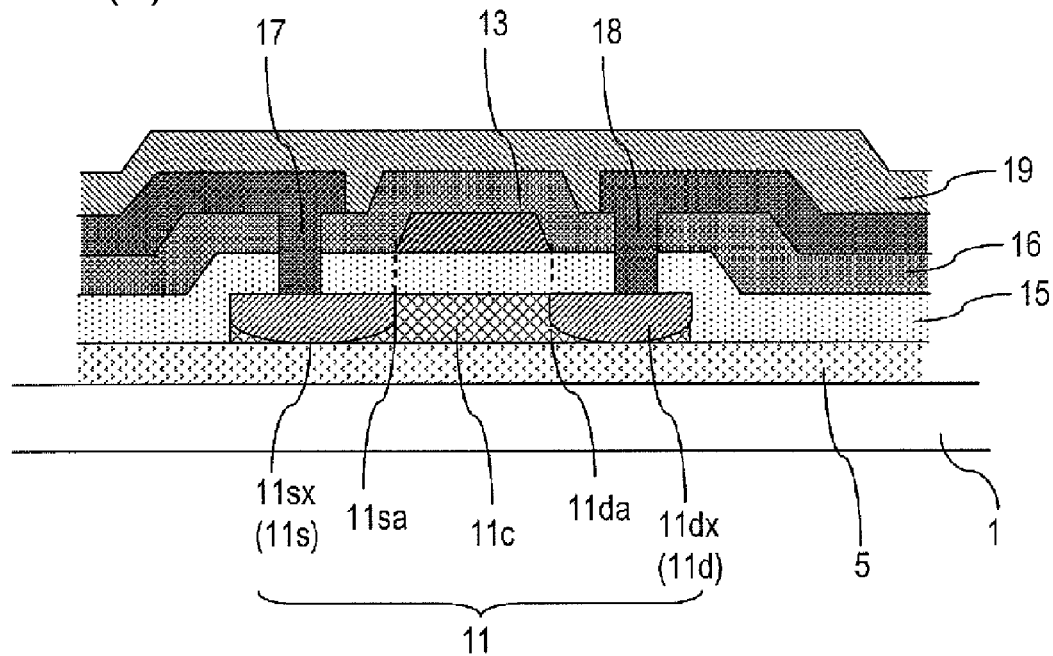

FIG. 1(a) is a plan view schematically showing a semiconductor device 100A of the present embodiment, and FIG. 1(b) is a cross-sectional view schematically showing the semiconductor device 100A. FIGS. 3(a) and 3(b) are respectively cross-sectional views schematically showing modification examples of the semiconductor device 100A.

The semiconductor device (TFT substrate) 100A of the present embodiment includes a substrate 1, and a TFT 10A supported by the substrate 1. The TFT 10A is a top-gate structure TFT, for example. The TFT 10A has an oxide semiconductor layer 11 that includes a channel region 11c, and a source region 11s and drain region 11d respectively positioned on either side of the channel region 11c. The TFT 10A has a gate insulating film 15 formed above the oxide semiconductor layer 11, and a gate electrode 13 that is formed above the gate insulating film 15 and that is arranged so as to overlap the channel region 11c. The TFT 10A also has a source electrode 17 and drain electrode 18 formed above the oxide semiconductor layer 11. An insulating film 5 is formed above the substrate 1. Sometimes, the insulating film 5 is not formed.

When a gate voltage (5V, for example) is not being applied to the gate electrode 13, the low-resistance source region 11sx of the source region 11s has a smaller resistance than the channel region 11c. When a gate voltage (5V, for example) is not being applied to the gate electrode 13, the low-resistance drain region 11dx of the drain region 11d has a smaller resistance than the channel region 11c. The low-resistance source region 11sx is connected to the source electrode 17. The low-resistance drain region 11dx is connected to the drain electrode 18.

The carrier concentration of the low-resistance source region 11sx and low-resistance drain region 11dx becomes progressively lower towards the channel region 11c from the connecting portion of the source electrode 17 and low-resistance source region 11sx and connecting portion of the drain electrode 18 and low-resistance drain region 11dx.

As explained in detail later, hydrogen contained in the source electrode 17 and drain electrode 18 adjacent to the oxide semiconductor layer 11 is diffused to a portion of the oxide semiconductor layer 11, and this portion of the oxide semiconductor layer 11 is reduced by oxygen contained in the oxide semiconductor layer 11 being lost. As such, the hydrogen is diffused to form the low-resistance source region 11sx and low-resistance drain region 11dx on regions that have lost the oxygen contained in the oxide semiconductor layer 11. The concentration gradient of the diffused hydrogen generates a concentration gradient of the carrier described above. Regions of the oxide semiconductor layer 11 that have not lost oxygen and where hydrogen has not been diffused remain as high-resistance regions. Accordingly, the channel region 11c, which has a higher resistance than the low-resistance source region 11sx and low-resistance drain region 11dx, is formed so as to be interposed between the low-resistance source region 11sx and the low-resistance drain region 11dx.

The source electrode 17 is connected to the low-resistance source region 11sx in a contact hole 17c formed in the gate insulating film 15, and the drain electrode 18 is connected to the low-resistance drain region 11dx in a contact hole 18c formed in the gate insulating film 15. It is preferable that the distance from the contact hole 17c to the gate electrode 13 be equal to the distance from the contact hole 18c to the gate electrode 13. With such a configuration, the gate electrode 13 and low-resistance source region 11sx and low-resistance drain region 11dx can be easily formed so as to overlap through the gate insulating film 15. As a result, variation in electrical characteristics of the TFT 10A can be suppressed. As explained in detail later, this presents the advantage of being able to form the gate electrode 13 and contact holes 17c and 18c in one round of photolithography.

As shown in FIG. 1(b), when seen from the direction normal to the substrate 1, at least a portion of the low-resistance source region 11sx or a portion of the low-resistance drain region 11dx overlaps the gate electrode 13. A channel length L1 of the channel region 11c is also smaller than a length L2 of the gate electrode 13 in the channel direction. It is preferable for a distance D1 from an end 11sa of the low-resistance source region 11sx below the gate electrode 13 to an end of the low-resistance source region 11sx side of the gate electrode 13 and a distance D2 from an end 11da of the low-resistance drain region 11dx below the gate electrode 13 to an end of the low-resistance drain region 11dx side of the gate electrode 13 to each be 10% to 20% of the channel length L1. It is preferable for the distance D1 and/or the distance D2 to be 0.2 μm to 2 μm. If the distances D1 and D2 are in the range described above, parasitic resistance can be prevented from becoming larger. This also has the advantages of suppressing an increase in the load capacity on the gate electrode 13 and increasing the current driving force. The limit value at which the diffusion of the hydrogen that forms the low-resistance source region 11sx and low-resistance drain region 11dx can be controlled is 0.2 μm, and 2 μm is a value that takes into account shifts in alignment between the position of the gate electrode 13 and the respective positions of the contact holes 17c and 18c. It is preferable for the low-resistance source region 11sx and/or the low-resistance drain region 11dx to reach the vicinity of the boundary of the oxide semiconductor layer 11 on the substrate 1 side. If the low-resistance source region 11sx and/or the low-resistance drain region 11dx reach the vicinity of the boundary of the oxide semiconductor layer 11 on the substrate 1 side, then variation in the electrical characteristics of the TFT 10A can be suppressed.

As such, if the low-resistance source region 11sx and low-resistance drain region 11dx are formed, the TFT 10A that has favorable TFT characteristics will be manufactured. As explained in detail later, it is possible to form the TFT 10A with a method of manufacturing that has fewer manufacturing steps than the method of manufacturing the oxide semiconductor TFT disclosed in Patent Document 1.

As shown in FIG. 1(b), when viewed from the direction normal to the substrate 1 and when a portion of the low-resistance source region 11sx and a portion of the low-resistance drain region 11dx overlap the gate electrode 13 through the gate insulating film 15, the distance Dsx from a portion of the low-resistance source region 11sx connected to the source electrode 17 to the end 11sa on the channel region 11c side and the distance Ddx from a portion of the low-resistance drain region 11dx connected to the drain electrode 18 to the end 11da of the channel region 11c side are as follows.

Figure 2:
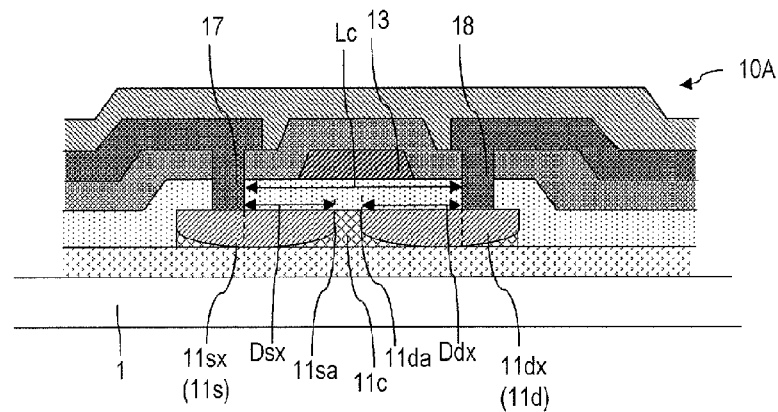
FIG. 2(a) is a cross-sectional view schematically showing a low-resistance source region 11sx and a low-resistance drain region 11dx.
FIG. 2(b) is a graph showing how to find lengths Dsx and Ddx shown in FIG. 2(a)
FIG. 2(c) is a graph in which the portions of line T2 and line T3 surrounded by the broken line in FIG. 2(b) have been magnified.
Figure 2:
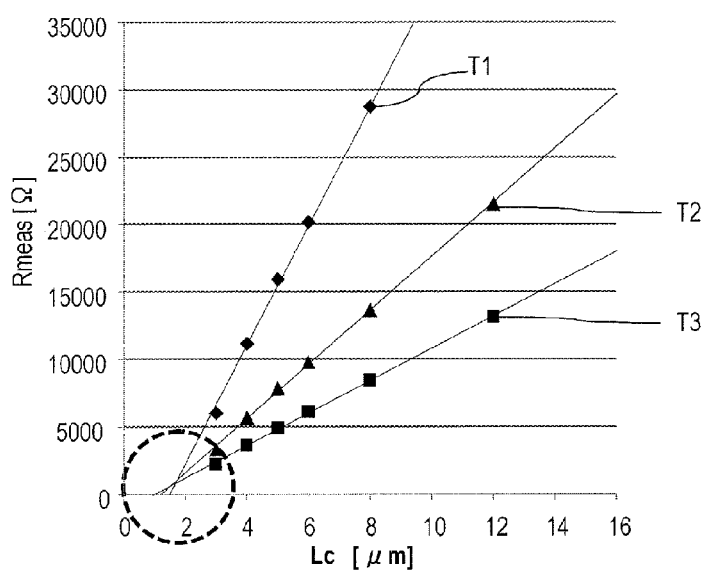
Figure 2:
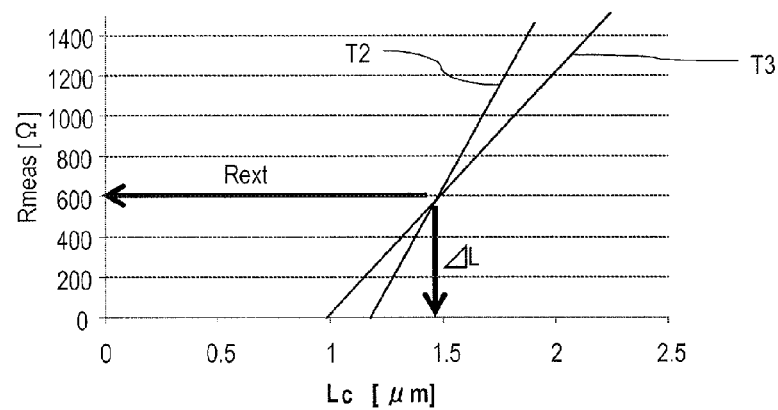

FIG. 2(a) is a cross-sectional view schematically showing how to find the distances Dsx and Ddx, and FIGS. 2(b) and 2(c) are graphs showing how to find the distances Dsx and Ddx.

As shown in FIG. 2(a), when viewed from the direction normal to the substrate 1, a portion of the low-resistance source region 11sx and a portion of the low-resistance drain region 11dx overlap the gate electrode 13 through the gate insulating film 15. The distance Dsx is the distance from the portion of the low-resistance source region 11sx connected to the source electrode 17 to the end of the channel region 11c side, and the distance Ddx is the distance from the portion of the low-resistance drain region 11dx connected to the drain electrode 18 to the end of the channel region 11c side. A distance Lc is the distance from the portion of the source electrode 17 connected to the low-resistance source region 11sx to the portion of the drain electrode 18 connected to the low-resistance drain region 11dx. The channel length of the channel region 11c that is computed from the electrical characteristics of the TFT 10A is an electric channel length Le. The electric channel length Le is computed using well-known methods, and thus, a detailed explanation thereof will be omitted. The difference between the distance Lc and the channel length Le is $\Delta L$ ($\Delta L=Lc-Le$). At this time, the sum of the distance Dsx and the distance Ddx is $\Delta L$ ($\Delta L=Dsx+Ddx$). $\Delta L/2=Dsx=Ddx$ is satisfied when the size of the distance Dsx and the distance Ddx are equal.

If the voltage between the gate electrode 13 and source electrode 17 is Vgs, and the drain current is Imeas, then a resistance value Rmeas between the source electrode 17 and drain electrode 18 satisfies Rmeas=Vgs/Imeas. Imeas is the current for each 1 µm of channel width. In other words, Imeas is the value of all current flowing between the source electrode 17 and drain electrode 18 divided by channel width. A resistance value Rext, which is the resistance value Rmeas excluding the resistance value of the channel region where the electric channel length Le is defined, includes the resistance value of the region where $\Delta L$ described above is defined and the resistance value of the respective portions of the low-resistance source region 11sx and low-resistance drain region 11dx connected to the source electrode 17 and drain electrode 18. The resistance value of the respective portions of the low-resistance source region 11sx and low-resistance drain region 11dx connected to the source electrode 17 and drain electrode 18 is very small (see Patent Document 2). Accordingly, the resistance value Rext is the resistance value of the region that substantially defines $\Delta L$ described above.

The above-mentioned $\Delta L$ and resistance value Rext can be found from a graph representing the relationship between the distance Lc between the source electrode 17 and drain electrode 18 when the gate voltage is changed and the resistance value Rmeas between the source electrode 17 and drain electrode 18.

FIG. 2(b) is a graph showing the relationship between the distance Lc (horizontal axis) and resistance value Rmeas (vertical axis) when voltages of 10V, 15V, and 20V are respectively applied to the gate electrode 13 of the TFT 10A shown in FIG. 2(a). FIG. 2(c) is a graph in which the portion of FIG. 2(b) surrounded by the broken line has been magnified. In FIG. 2(c), line T1 is omitted. In FIGS. 2(b) and 2(c), line T1 shows the relationship between the distance Lc and resistance value Rmeas when the voltage Vgs between the gate electrode 13 and source electrode 17 is 10V (Vgs=10V), line T2 shows the relationship between the distance Lc and resistance value Rmeas when the voltage Vgs between the gate electrode 13 and source electrode 17 is 15V (Vgs=15V), and line T3 shows the relationship between the distance Lc and resistance value Rmeas when the voltage Vgs between the gate electrode 13 and source electrode 17 is 20V (Vgs=20V).

As shown in FIG. 2(c), the coordinates of the horizontal axis at the intersection of lines T2 and T3 express the length $\Delta L$ described above, for example, and the coordinates of the vertical axis at the intersection of lines T2 and T3 express the resistance value Rext described above, for example. In this way, the length $\Delta L$ and resistance value Rext can be found.

As shown in FIG. 3(a), it is not necessary for the low-resistance source region 11sx and low-resistance drain region 11dx to partially overlap the gate electrode 13. In this case, it is preferable to form the low-resistance source region 11sx and/or the low-resistance drain region 11dx such that a distance Ds from at least one end of the low-resistance source region 11sx or one end of the low-resistance drain region 11dx to one end of the gate electrode 13 is greater than 1 µm and less than or equal to 0.5 µm (0 µm<Ds≤0.5 µm).

As shown in FIG. 3(b), when viewed from the direction normal to the substrate 1, the low-resistance source region 11sx and/or the low-resistance drain region 11dx may be formed such that one at least one end of the low-resistance source region 11sx or one end of the low-resistance drain region 11dx is consistent with one end of the gate electrode 13. When the low-resistance source region 11sx and/or the low-resistance drain region 11dx is formed as such, there is the advantage of not having an increase in the load capacity on the gate electrode 13.

It is preferable for the carrier concentration on the end portions of the low-resistance source region 11sx and low-resistance drain region 11dx on the channel region 11c side to be $10^{18}$ cm$^{-3}$ to $10^{20}$ cm$^{-3}$. If the carrier concentration is within such a range, parasitic resistance of the TFT can be suppressed, the low-resistance source region 11sx and low-resistance drain region 11dx can be prevented from extending close to the channel region 11c, and parasitic capacitance between the low-resistance source region 11sx and low-resistance drain region 11dx can be reduced.

The semiconductor device 100A has an interlayer insulating film 16 formed so as to cover the gate electrode 13, and a protective film 19 formed so as to cover the source electrode 17 and drain electrode 18.

The insulating film 5, gate insulating film 15, interlayer insulating film 16, and protective film 19 are made of $SiO_2$ (silicon oxide), for example. The thickness of the insulating film 5 is approximately 100 nm, for example. The thickness of the gate insulating film 15 is approximately 250 nm, for example. The thickness of the interlayer insulating film 16 and protective film 19 is approximately 1000 nm each, for example. The insulating film 5, gate insulating film 15, interlayer insulating film 16, and protective film 19 are sometimes made of $SiN_x$ (silicon nitride), and sometimes made of $SiN_x$ and $SiO_2$, for example.

The oxide semiconductor layer 11 includes an In—Ga—Zn—O (IGZO) semiconductor, for example. The element ratio of In, Ga, and Zn is In:Ga:Zn=1:1:1, for example. However, the element ratio of In, Ga, and Zn is not limited thereto. Instead of IGZO, a different oxide semiconductor film may be used to form the oxide semiconductor layer 11. A Zn—O semiconductor (ZnO) film, an In—Zn—O semiconductor (IZO) film, a Zn—Ti—O semiconductor (ZTO) film, a Cd—Ge—O semiconductor film, a Cd—Pb—O semiconductor film, or the like may be used, for example. It is preferable to use an amorphous oxide semiconductor film as the oxide semiconductor film. This is because an amorphous oxide semiconductor film can be manufactured at low temperature and can achieve a high mobility. The thickness of the oxide semiconductor layer 11 is approximately 40 nm, for example.

The gate electrode 13 has a multilayer structure in which the bottom layer is a Ti layer, the middle layer is an Al (aluminum) layer, and the top layer is a Ti layer (Ti/Al/Ti), for example. Besides these, the gate electrode 13 may also have a single layer or multilayer structure made of Ti, Mo, Ta (tantalum), W (tungsten), Cu (copper), or the like, or may include a metal alloy of these. The thickness of the gate electrode 13 is approximately 400 nm, for example.

The source electrode 17 and drain electrode 18 have a multilayer structure in which the bottom layer is a Ti layer, the middle layer is an Al (aluminum) layer, and the top layer is a Ti layer (Ti/Al/Ti), for example. It is preferable that the portion (bottom layer) of the source electrode 17 and drain electrode 18 that is in contact with the oxide semiconductor layer 11 include Ti, Mo, Sn (tin), Zn (zinc), or the like. These elements have an effect of reducing the oxide semiconductor layer 11. The thickness of the source electrode 17 and drain electrode 18 is approximately 500 nm, for example.

Figure 4:
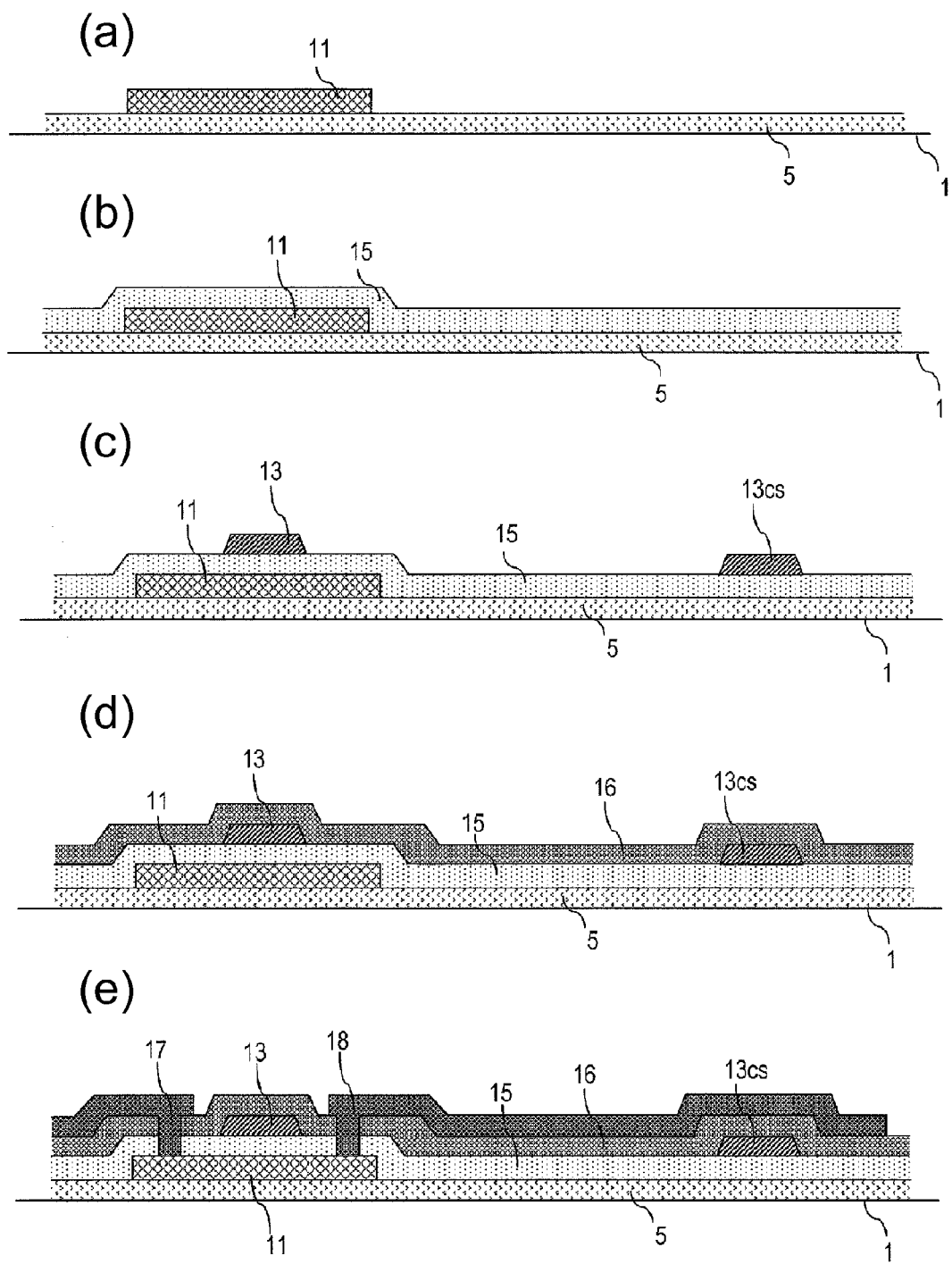
FIGS. 4(a) to 4(e) are respectively cross-sectional views of steps that show one example of a method of manufacturing the semiconductor device 100A.
Figure 5:
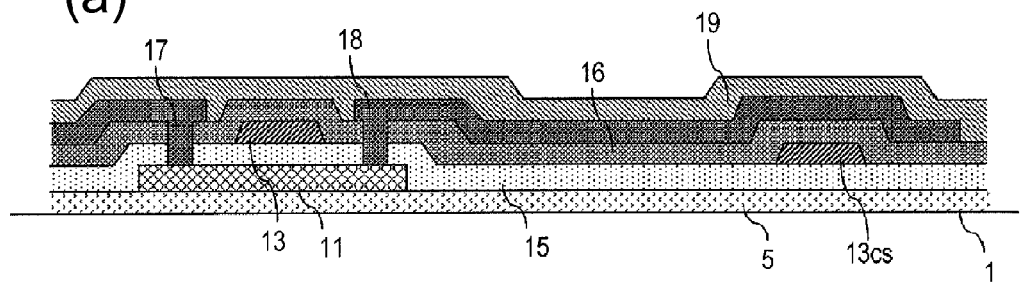
FIGS. 5(a) to 5(d) are respectively cross-sectional views of steps that show one example of a method of manufacturing the semiconductor device 100A.
Figure 5:
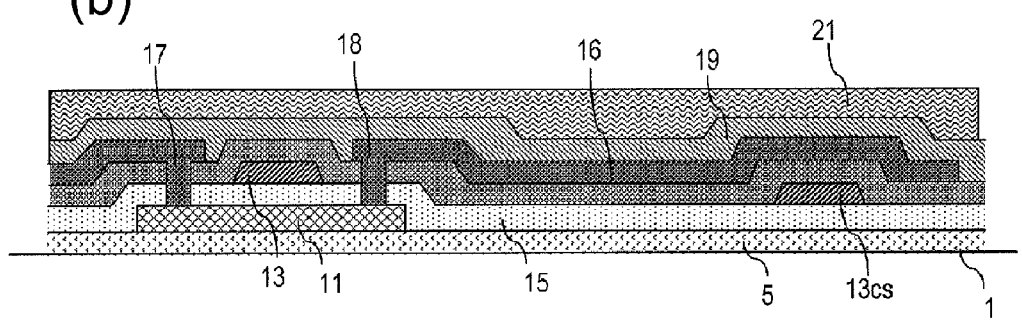
Figure 5:
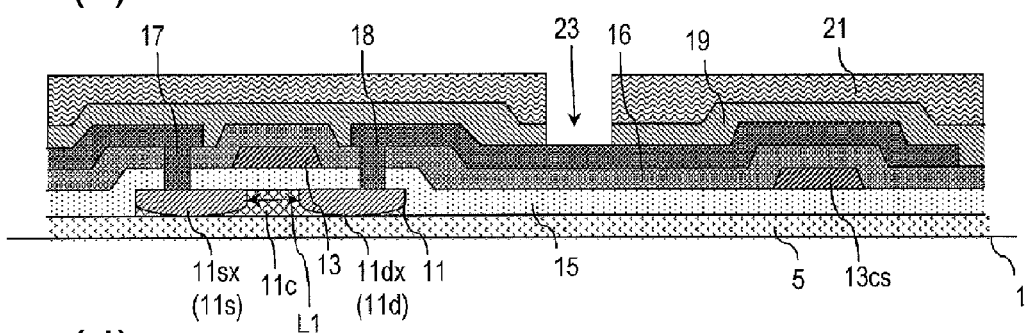
Figure 5:
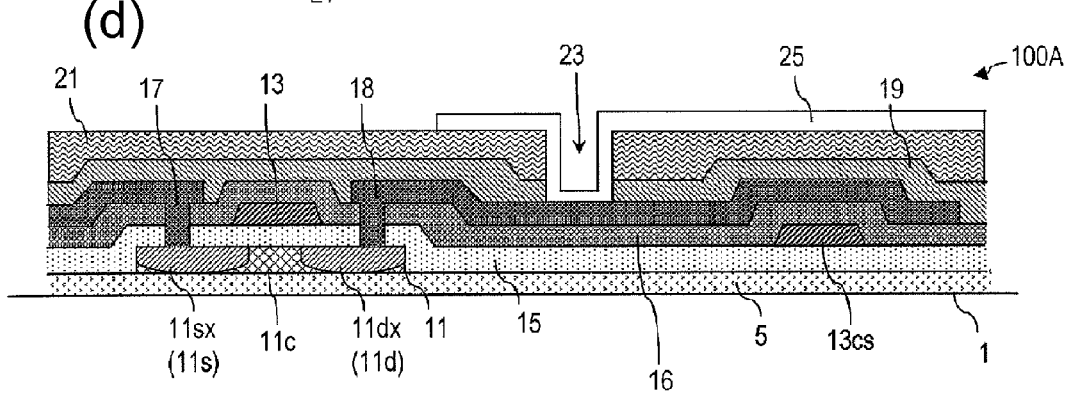
Figure 6:
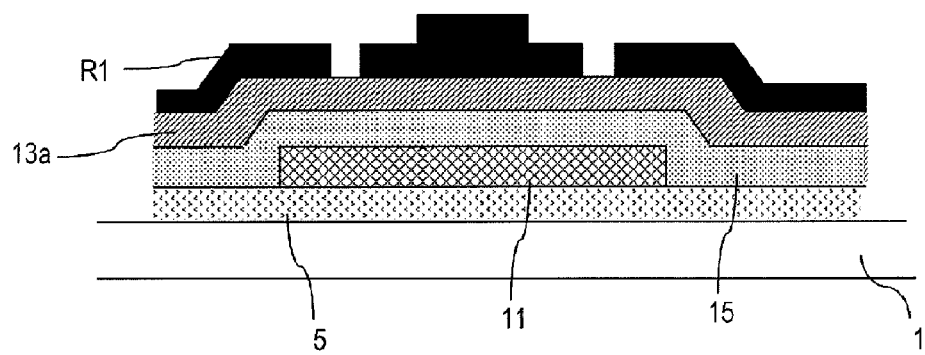
FIGS. 6(a) to 6(c) are respectively cross-sectional views of steps that show a modification example of a method of manufacturing the semiconductor device 100A.
Figure 6:
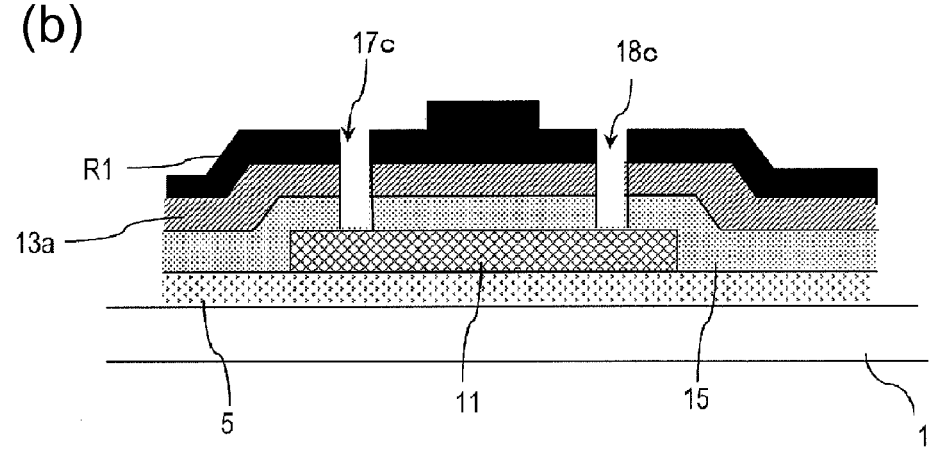
Figure 6:
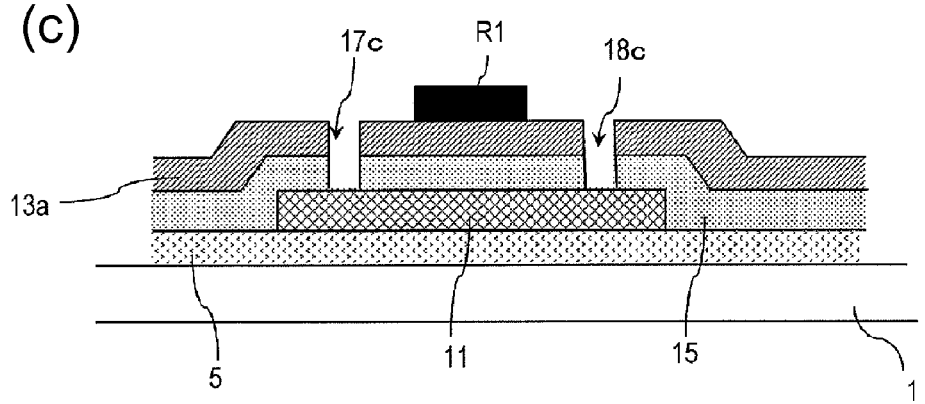
Figure 7:
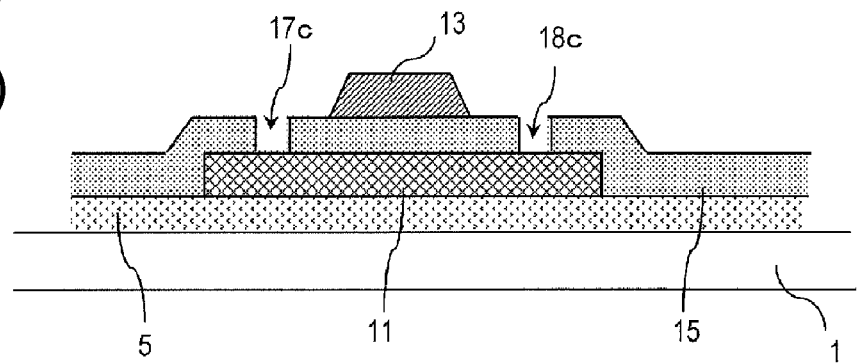
FIGS. 7(a) to 7(d) are respectively cross-sectional views of steps that show a modification example of a method of manufacturing the semiconductor device 100A.
Figure 7:
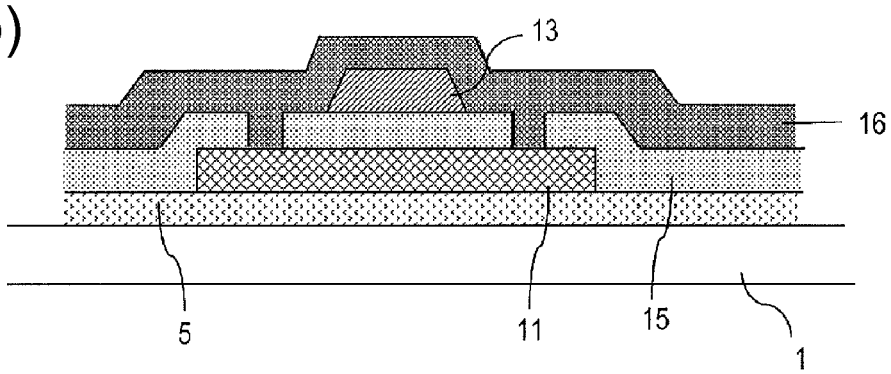
Figure 7:
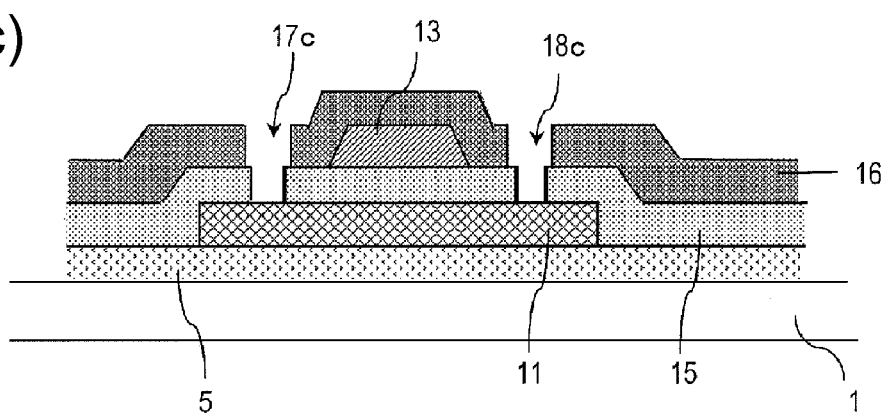
Figure 7:
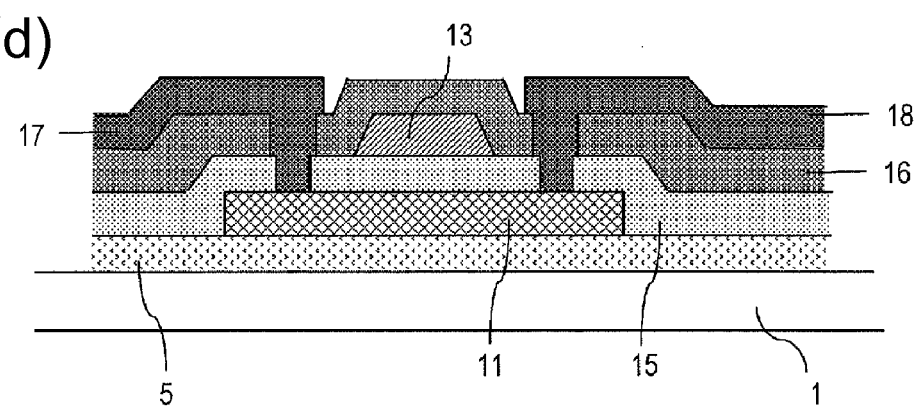

Next, a method of manufacturing the semiconductor device 100A according to one embodiment of the present invention will be explained with reference to FIGS. 4 and 5. FIGS. 4(a) to 4(e) and FIGS. 5(a) to 5(d) are each cross-sectional views showing a method of manufacturing the semiconductor device 100A.

First, as shown in FIG. 4(a), the insulating film 5 is formed on a substrate (a glass substrate, for example) 1 using a well-known method. Next, the oxide semiconductor layer 11 is formed above the insulating film 5 by sputtering.

The oxide semiconductor layer 11 includes an In—Ga—Zn—O (IGZO) semiconductor, and the element ratio of In, Ga, and Zn is In:Ga:Zn=1:1:1, for example. The element ratio of In, Ga, and Zn is not limited thereto.

Next, as shown in FIG. 4(b), the gate insulating film 15 is formed so as to cover the oxide semiconductor layer 11 using a well-known method.

Next, as shown in FIG. 4(c), the gate electrode 13 and an auxiliary capacitance electrode 13cs are formed above the gate insulating film 15 each using a well-known method. The gate electrode 13 is formed above the oxide semiconductor layer 11. The auxiliary capacitance electrode 13cs is made of the same conductive film that is used to form the gate electrode 13. Sometimes, the auxiliary capacitance electrode 13cs is not formed.

Next, as shown in FIG. 4(d), an interlayer insulating film 16 is formed so as to cover the gate electrode 13 using a well-known method.

Next, as shown in FIG. 4(e), contact holes are formed in the gate insulating film 15 and interlayer insulating film 16 above the oxide semiconductor layer 11, and then the source electrode 17 and drain electrode 18 are formed by sputtering. The oxide semiconductor layer 11 and source electrode 17, and the oxide semiconductor layer 11 and the drain electrode 18 are then in contact with each other. The source electrode 17 and drain electrode 18 each have a multilayer structure made of Ti/Al/Ti layers, for example. The portion of the source electrode 17 and drain electrode 18 that is in contact with the oxide semiconductor layer 11 has Ti, for example. As described above, the portions of the source electrode 17 and drain electrode 18 that are in contact with the oxide semiconductor layer 11 may have Mo, for example. The drain electrode 18 is formed so as to cover the auxiliary capacitance electrode 13cs.

Next, as shown in FIG. 5(a), the protective film 19 is formed so as to cover the source electrode 17 and drain electrode 18 using a well-known method (CVD (chemical vapor deposition), for example). Hydrogen is supplied to the source electrode 17 and drain electrode 18 by hydrogen plasma treatment performed while depositing the protective film 19 by CVD, for example. The protective film 19 formed in this way sometimes contains hydrogen.

Next, as shown in FIG. 5(b), a photosensitive organic insulating film 21 is formed on the protective film 19 using a well-known method. The thickness of the photosensitive organic insulating film 21 is approximately 2.5 μm, for example. Sometimes, the photosensitive organic insulating film 21 is not formed.

Next, as shown in FIG. 5(c), a contact hole 23 is formed using a well-known method in the protective film 19 and photosensitive organic insulating film 21 positioned between the gate electrode 13 and auxiliary capacitance electrode 13cs. Thereafter, annealing is performed at a temperature of 250° C. to 400° C. (or more preferably, 300° C. to 350° C.). If the temperature during annealing is below 250° C., then the threshold voltage of the TFT can vary, and if the temperature exceeds 400° C. then the channel length L1 and the characteristics of the TFT can vary.

Such an annealing process diffuses the hydrogen contained in the source electrode 17 and drain electrode 18 in a direction that is parallel to the channel length L1 of the oxide semiconductor layer 11. Sometimes, annealing after the protective film 19 is formed diffuses the hydrogen contained in the protective film 19 to the oxide semiconductor layer 11 by going through the source electrode 17 and drain electrode 18. The diffused hydrogen bonds with the IGZO semiconductor that is contained in the oxide semiconductor layer 11 and bonds with oxygen contained in the oxide semiconductor layer 11 to detach as an OH group, thereby generating an oxygen vacancy. As a result, the carrier concentration of a portion of the oxide semiconductor layer 11 becomes higher, and the low-resistance source region 11sx and low-resistance drain region 11dx are formed. This hydrogen diffusion sometimes makes the low-resistance source region 11sx and/or low-resistance drain region 11dx reach the vicinity of the boundary of the oxide semiconductor layer 11 on the substrate 1 side. The low-resistance source region 11sx and low-resistance drain region 11dx are sometimes formed by a redox reaction between the metal contained in the source electrode 17 and drain electrode 18 (Ti (titanium), for example) and the IGZO semiconductor, for example.

There is no special limitation on the time for performing annealing, but it is preferably 0.5 hours (30 minutes) to 3 hours, and more preferably 1 hours to 2 hours. If the time is less than 0.5 hours, there can be variation in the threshold voltage of the TFT, and if the time is greater than 3 hours, manufacturing efficiency will be poor.

If the annealing parameters are set to 300° C. for 1 hour, then the lengths from the portion of the low-resistance source region 11sx and low-resistance drain region 11dx in contact with the source electrode 17 and drain electrode 18 to the respective end portions on the channel region 11c side are each approximately 2 µm.

The hydrogen that is diffused during annealing is provided to the source electrode and drain electrode by hydrogen plasma treatment performed while depositing the protective film 19 by CVD, for example.

Next, as shown in FIG. 5(d), a transparent electrode 25 is formed using a well-known method so as to be electrically connected to the drain electrode 18 through the contact hole 23. The transparent electrode 25 is made of ITO (indium tin oxide), for example. The thickness of the transparent electrode 25 is approximately 100 nm, for example.

With such a method of manufacturing, the semiconductor device 100A is manufactured.

The method of manufacturing the semiconductor device 100A described above can be modified to the method of manufacturing described below.

FIGS. 6(a) to 6(c) and FIGS. 7(a) to 7(d) are each cross-sectional views schematically showing a modification example for the method of manufacturing the semiconductor device 100A. In FIGS. 6 and 7, an explanation of the method of manufacturing the auxiliary capacitance electrode 13cs that is formed in the semiconductor device 100A will be omitted.

As described above, the insulating film 5 is formed on the substrate (a glass substrate, for example) 1 using a well-known method, and the oxide semiconductor layer 11 is formed above the insulating film 5 by sputtering. Thereafter, the gate insulating film 15 is formed above the oxide semiconductor layer 11 using a well-known method.

Next, as shown in FIG. 6(a), a conductive film 13a that forms the gate electrode 13 is formed above the gate insulating film 15 using a well-known method.

Next, a resist film R1 is formed above the conductive film 13a using a halftone exposure method. The resist film R1 is formed such that the portions of the resist film R1 that form the contact holes 17c and 18c, described later, each have an opening therein, and the thickness of the portion of the resist film R1 forming the gate electrode 13, described later, is greater than the other portions.

Next, as shown in FIG. 6(b), the contact holes 17c and 18c are formed in the gate insulating film 15 using a well-known method.

Next, as shown in FIG. 6(c), ashing is performed to remove a portion of the resist film R1. This ashing treatment leaves behind the portion of the resist film R1 that forms the gate electrode 13.

Next, as shown in FIG. 7(a), the conductive film 13a is etched using a well-known method to form the gate electrode 13.

Next, as shown in FIG. 7(b), the interlayer insulating film 16 is formed above the gate electrode 13 using a well-known method.

Next, as shown in FIG. 7(c), the contact holes 17c and 18c are formed in the interlayer insulating film 16 using a well-known method.

Next, as shown in FIG. 7(d), the source electrode 17 and drain electrode 18 are formed using a well-known method such that the source electrode 17 and drain electrode 18 make contact with the oxide semiconductor layer 11 in the contact holes 17c and 18c.

Thereafter, the semiconductor device 100A is manufactured through manufacturing steps like those shown in FIGS. 5(a) to 5(d).

If the semiconductor device 100A is manufactured with such methods, the semiconductor device 100A will have the distance from the gate electrode 13 to the contact hole 17c equal to the distance from the gate electrode 13 to the contact hole 18c. The semiconductor device 100A manufactured with such a method of manufacturing does not have shifts in alignment between the respective contact holes 17c and 18c and the gate electrode 13, and thus, the gate electrode 13 and low-resistance source region 11sx and low-resistance drain region 11dx are easily formed so as to overlap through the gate insulating film 15. As a result, variation in the electrical characteristics of the TFT 10A can be suppressed.

Figure 8:
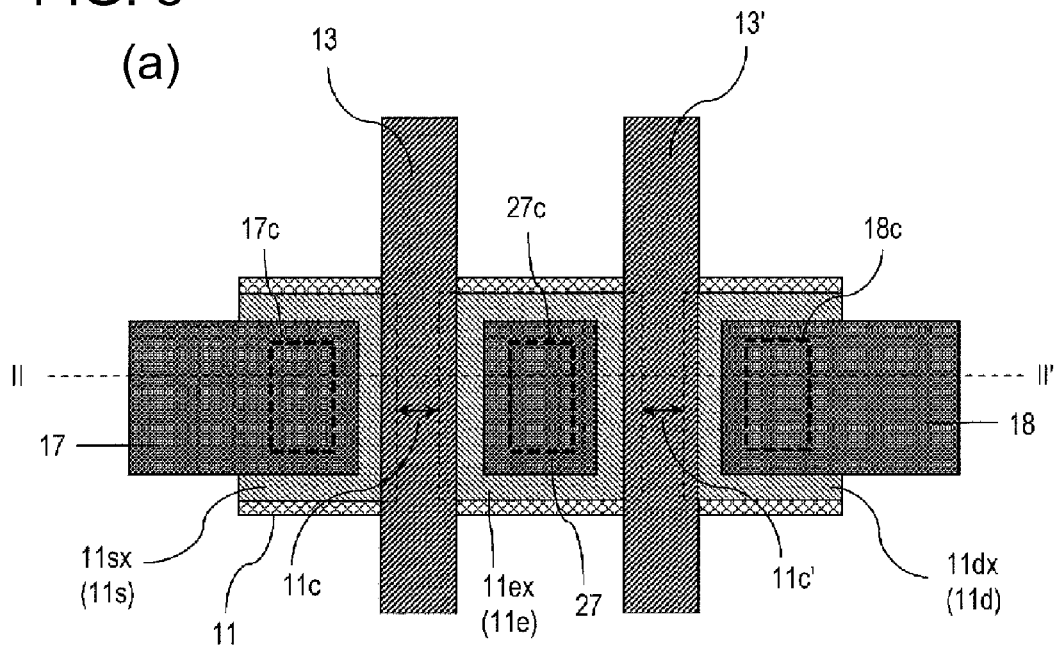
FIG. 8(a) is a plan view schematically showing a semiconductor device 100B in another embodiment of the present invention.
FIG. 8(b) is a cross-sectional view schematically showing the semiconductor device 100B in FIG. 8(a) along the line II-II'.
Figure 8:
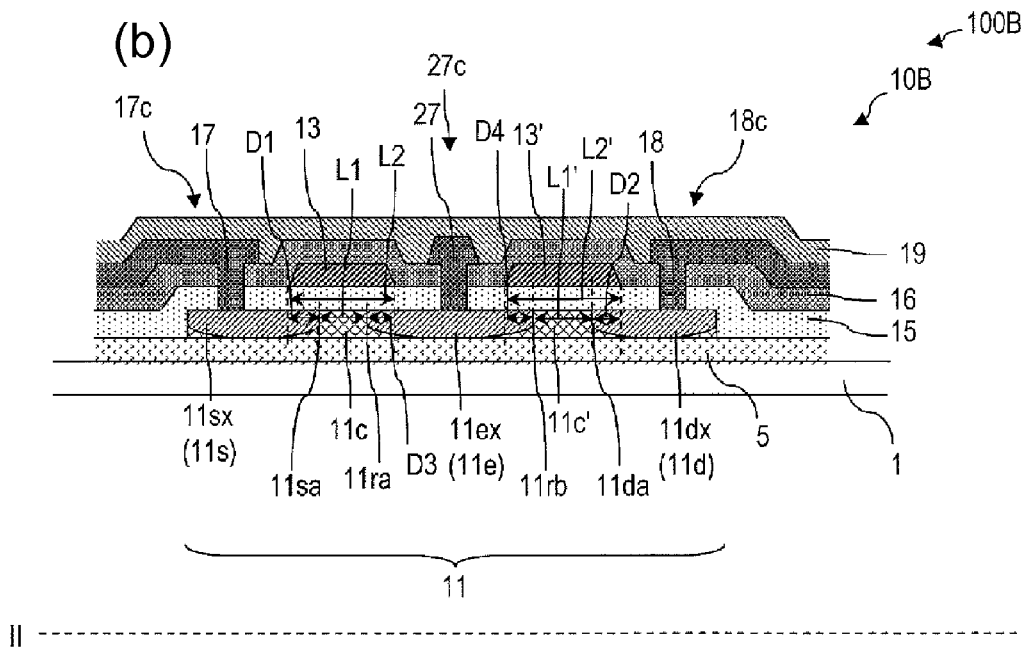

Next, a semiconductor device 100B of another embodiment according to the present invention will be explained with reference to FIG. 8. FIG. 8(a) is a plan view schematically showing the semiconductor device 100B, and FIG. 8(b) is a cross-sectional view schematically showing the semiconductor device 100B. Constituting elements that are shared with the semiconductor device 100A will be given the same reference characters, and duplicate explanations will be avoided.

As shown in FIGS. 8(a) and 8(b), the semiconductor device 100B has a substrate 1 and a TFT 10B supported by this substrate 1. The TFT 10B has a so-called double gate structure. The TFT 10B differs from the TFT 10A in having two gate electrodes 13 and 13', and two channel regions 11c and 11c'. The TFT 10B also has a middle electrode 27 between the gate electrode 13 and the gate electrode 13'. An oxide semiconductor layer 11 of the TFT 10B has a middle semiconductor region 11e between a source region 11s and a drain region 11d. The channel region 11c is positioned between the source region 11s and middle semiconductor region 11e. The channel region 11c' is positioned between the middle semiconductor region 11e and drain region 11d. The middle electrode 27 is formed above the oxide semiconductor layer 11.

When a gate voltage (5V, for example) is not being applied to the gate electrode 13 and gate electrode 13', the middle semiconductor region 11e has a low-resistance middle region 11ex where resistance is smaller than the channel regions 11c and 11c'. The low-resistance middle region 11ex is connected to the middle electrode 27.

The carrier concentration of the low-resistance middle region 11ex becomes progressively lower from the connecting portion with the middle electrode 27 towards the channel region 11c, and progressively lower from the connecting portion with the middle electrode 27 towards the channel region 11c'. The low-resistance middle region 11ex is formed by the formation of the middle electrode 27.

When viewed from the direction normal to the substrate, at least a portion of the low-resistance source region 11sx or a portion of the low-resistance middle region 11ex overlaps with the gate electrode 13, and/or, at least a portion of the low-resistance drain region 11dx or a portion of the low-resistance middle region 11ex overlaps with the gate electrode 13'. A channel length L1 of the channel region 11c is also smaller than a length L2 of the gate electrode 13 in the channel direction. A channel length L1' of the channel region 11c' is also smaller than a length L2' of the gate electrode 13' in the channel direction. It is preferable that a distance D1 and a distance D3 respectively be 10% to 20% of the channel length L1, where the distance D1 is from an end 11sa of the low-resistance source region 11sx below the gate electrode 13 to an end on the low-resistance source region 11sx side of the gate electrode 13, and the distance D3 is from an end 11ra of the low-resistance middle region 11ex below the gate electrode 13 to an end on the low-resistance source region 11sx side of the gate electrode 13. In a similar manner, it is preferable that a distance D2 and a distance D4 respectively be 10% to 20% of the channel length L1', where the distance D2 is from an end 11da of the low-resistance drain region 11dx below the gate electrode 13 to an end on the low-resistance drain region 11dx side of the gate electrode 13, and the distance D4 from an end 11rb of the low-resistance middle region 11ex below the gate electrode 13' to an end on the low-resistance middle region 11ex side of the gate electrode 13. It is preferable for the distance D1 and/or the distance D3 to be 0.2 μm to 2 μm. It is preferable for the distance D2 and/or the distance D4 to be 0.2 μm to 2 μm. If the distances D1, D2, D3, and D4 are in the ranges described above, parasitic resistance can be prevented from becoming larger. This also has the advantages of suppressing an increase in the load capacity on the gate electrodes 13 and 13' and increasing the current driving force. The TFT 10B, which has favorable TFT characteristics, can be manufactured if the low-resistance source region 11sx, low-resistance drain region 11dx, and low-resistance middle region 11ex are formed as such. As explained in detail later, it is possible to form the TFT 10B with a method of manufacturing that has fewer manufacturing steps than the method of manufacturing of the oxide semiconductor TFT disclosed in Patent Document 1.

Figure 9:
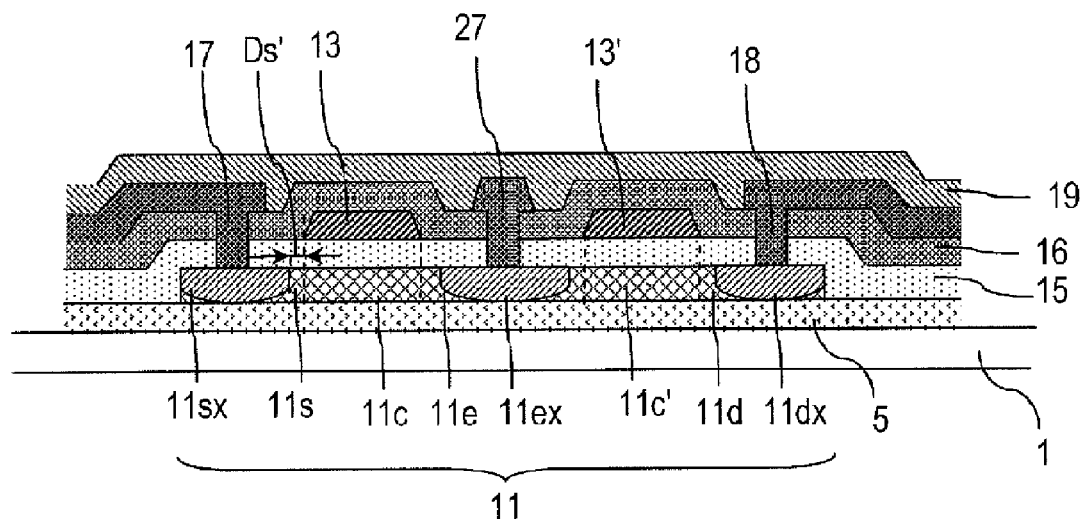
FIGS. 9(a) and 9(b) are respectively cross-sectional views schematically showing a modification example of the semiconductor device 100B.
Figure 9:
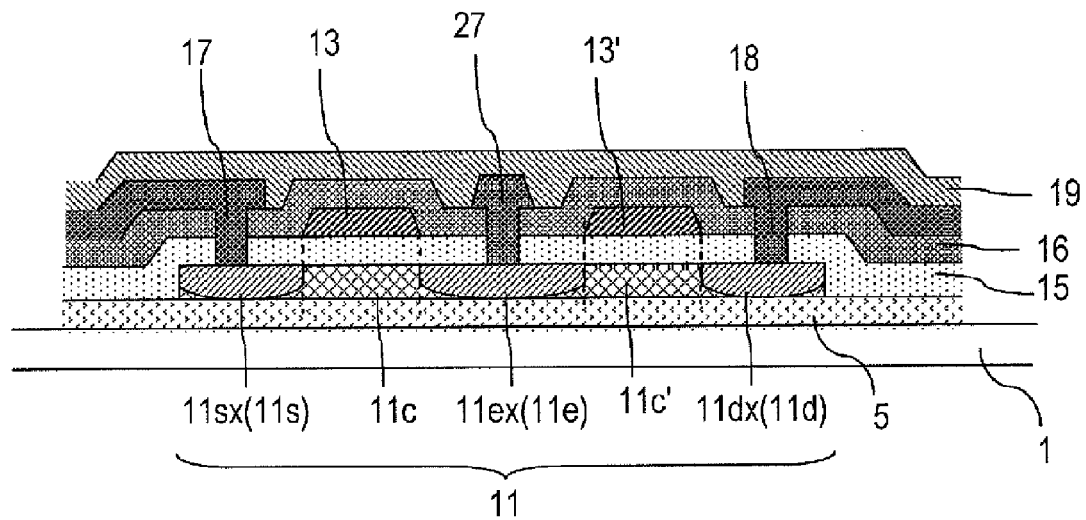

As shown in FIG. 9(a), it is not necessary for the low-resistance source region 11sx, low-resistance drain region 11dx, and low-resistance middle region 11ex to each partially overlap with the corresponding gate electrodes 13 and 13'. In this case, the low-resistance source region 11sx, the low-resistance drain region 11dx, and/or the low-resistance middle region 11ex may be formed such that a distance Ds' from at least one end of the low-resistance source region 11sx, one end of the low-resistance drain region 11dx, or one end of the low-resistance middle region 11ex to one end of the corresponding gate electrodes 13 and 13' is greater than 0 μm and less than or equal to 0.5 μm (0 μm<Ds'≤0.5 μm).

As shown in FIG. 9(b), when viewed from the normal direction of the substrate 1, the low-resistance source region 11sx, low-resistance drain region 11dx, and/or low-resistance middle region 11ex may be formed such that at least one end of the low-resistance source region 11sx, one end of the low-resistance drain region 11dx, or one end of the low-resistance middle region 11ex is consistent with one end of the corresponding gate electrodes 13 and 13'. When the low-resistance source region 11sx and/or the low-resistance drain region 11dx is formed as such, there is the advantage of not having an increase in the load capacity on the gate electrodes 13 and 13'.

The middle electrode 27 has a multilayer structure in which the bottom layer is a Ti layer, the middle layer is an Al layer, and the top layer is a Ti layer (Ti/Al/Ti), for example. It is preferable that the portion (bottom layer) of the source electrode 17 and drain electrode 18 that is in contact with the oxide semiconductor layer 11 include Ti, Mo, Sn (tin), Zn (zinc), or the like. These elements have an effect of reducing the oxide semiconductor layer 11. The thickness of the middle electrode 27 is approximately 500 nm, for example.

Figure 10:
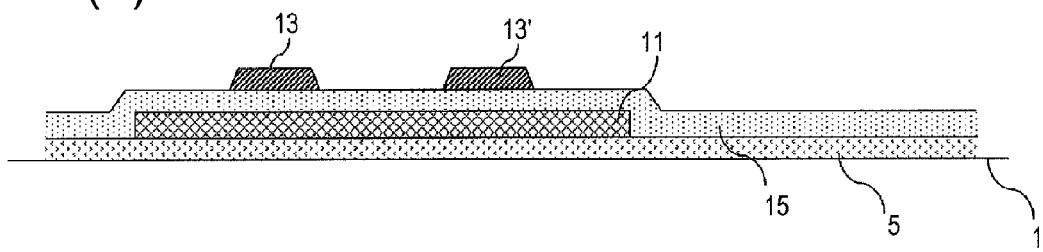
FIGS. 10(a) to 10(d) are respectively cross-sectional views of steps that show one example of a method of manufacturing the semiconductor device 100B.
Figure 10:
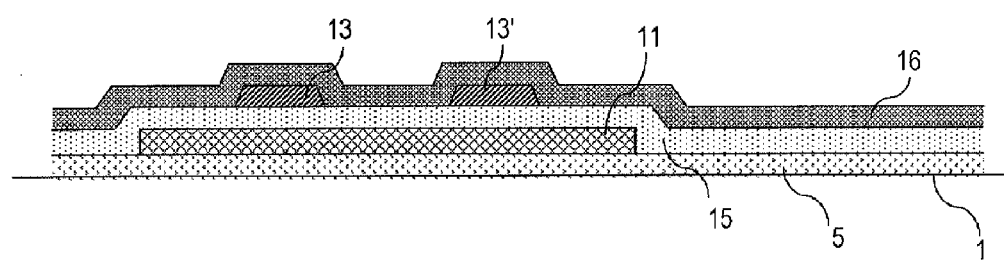
Figure 10:
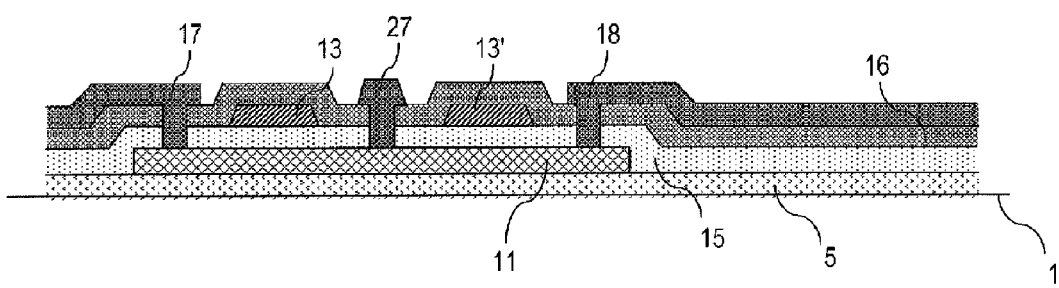
Figure 10:
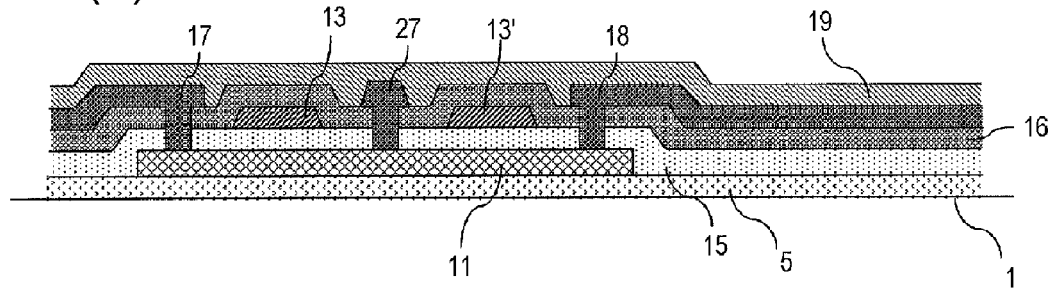
Figure 11:
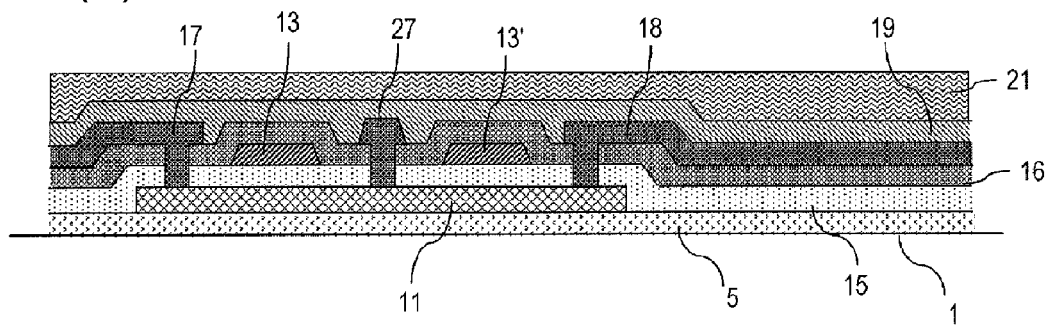
FIGS. 11(a) to 11(c) are respectively cross-sectional views of steps that show one example of a method of manufacturing the semiconductor device 100B.
Figure 11:
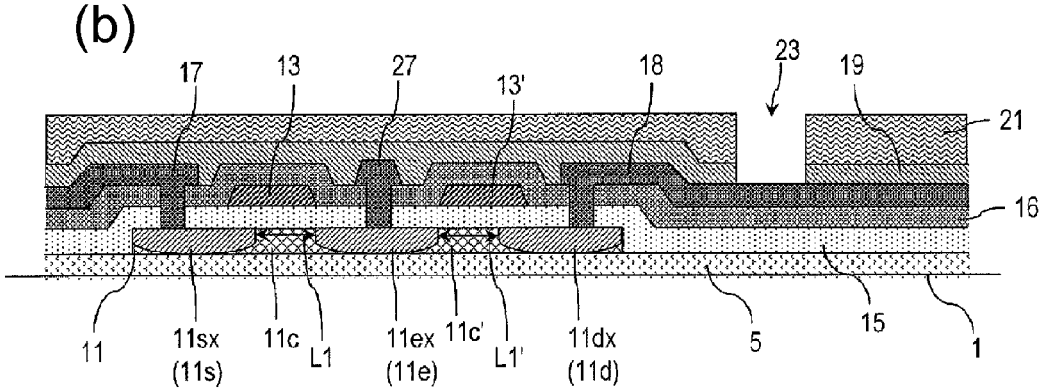
Figure 11:
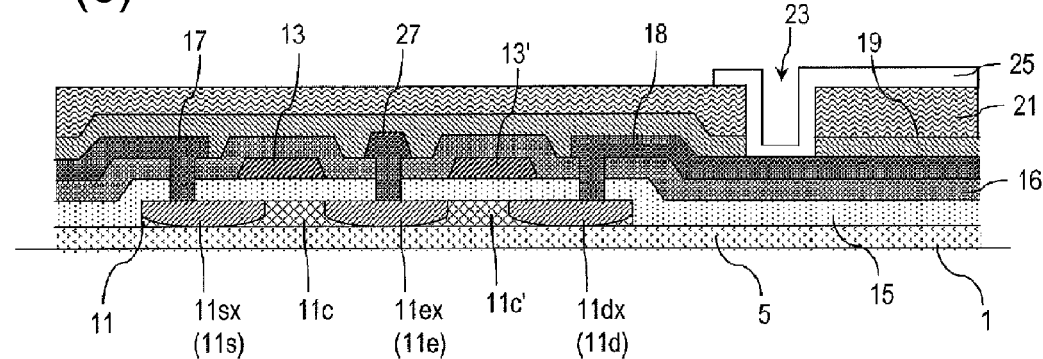

Next, a method of manufacturing the semiconductor device 100B according to one embodiment of the present invention will be explained with reference to FIGS. 10 and 11.

FIGS. 10(a) to 10(d) and FIGS. 11(a) to 11(c) are respectively cross-sectional views showing a method of manufacturing the semiconductor device 100B. Both the semiconductor device 100B and the semiconductor device 100A have the auxiliary capacitance electrode 13cs formed in a similar manner, and an explanation of the auxiliary capacitance electrode 13cs will be omitted in a method of manufacturing the semiconductor device 100B described below.

As described above, the insulating film 5 is formed on a substrate (a glass substrate, for example) 1 using a well-known method. Next, the oxide semiconductor layer 11 is formed above the insulating film 5 by sputtering.

The oxide semiconductor layer 11 includes an In—Ga—Zn—O (IGZO) semiconductor, and the element ratio of In, Ga, and Zn is In:Ga:Zn=1:1:1, for example. The element ratio of In, Ga, and Zn is not limited thereto.

Next, the gate insulating film 15 is formed so as to cover the oxide semiconductor layer 11 using a well-known method.

Next, as shown in FIG. 10(a), the gate electrodes 13 and 13' are each formed above the gate insulating film 15 using a well-known method. The gate electrodes 13 and 13' are each formed above the oxide semiconductor layer 11. The gate electrode 13 and gate electrode 13' are each made of the same conductive film.

Next, as shown in FIG. 10(b), the interlayer insulating film 16 is formed so as to cover the gate electrodes 13 and 13' using a well-known method.

Next, as shown in FIG. 10(c), contact holes are formed in the gate insulating film 15 and interlayer insulating film 16 above the oxide semiconductor layer 11, and then the source electrode 17, drain electrode 18, and middle electrode 27 are formed by sputtering, and the source electrode 17, drain electrode 18, and middle electrode 27 are made to be in contact with the oxide semiconductor layer 11. The source electrode 17, drain electrode 18, and middle electrode 27 each have a multilayer structure made of Ti/Al/Ti layers, for example. The portions of the source electrode 17, drain electrode 18, and middle electrode 27 that are in contact with the oxide semiconductor layer 11 respectively have Ti, for example. As described above, the portions of the source electrode 17, drain electrode 18, and middle electrode 27 that are in contact with the oxide semiconductor layer 11 may respectively have Mo, for example. The middle electrode 27 is formed between the source electrode 17 and drain electrode 18.

Next, as shown in FIG. 10(d), the protective film 19 is formed so as to cover the source electrode 17, drain electrode 18, and middle electrode 27 using a well-known method.

Next, as shown in FIG. 11(a), the photosensitive organic insulating film 21 is formed on the protective film 19 using a well-known method. The thickness of the photosensitive organic insulating film 21 is approximately 2.5 μm, for example. Sometimes, the photosensitive organic insulating film 21 is not formed.

Next, as shown in FIG. 11(b), the contact hole 23 is formed using a well-known method in the protective film 19 and photosensitive organic insulating film 21 positioned between the gate electrode 13 and auxiliary capacitance electrode 13cs (not shown). Thereafter, annealing is performed with the parameters described above. This forms the low-resistance source region 11sx, low-resistance drain region 11dx, and low-resistance middle region 11ex.

Next, as shown in FIG. 11(c), the transparent electrode 25 is formed using a well-known method so as to be electrically connected to the drain electrode 18 through the contact hole 23. The transparent electrode 25 is made of ITO, for example. The thickness of the transparent electrode 25 is approximately 100 nm, for example.

With such a method of manufacturing, the semiconductor device 100B is manufactured.

According to one embodiment of the present invention, a method of manufacturing an oxide semiconductor TFT that has fewer manufacturing steps than the method of manufacturing the oxide semiconductor TFT disclosed in Patent Document 1, and an oxide semiconductor TFT that can be obtained by such a method of manufacturing, are provided.

INDUSTRIAL APPLICABILITY

The embodiments of the present invention can be applied to a wide range of devices provided with thin-film transistors, such as circuit substrates such as active matrix substrates, display devices such as liquid crystal display devices, organic electroluminescence (EL) display devices and inorganic electroluminescence display devices, imaging devices such as image sensor devices, and electronic devices such as image input devices and fingerprint reading devices. In particular, the embodiments of the present invention can be suitably applied to large-sized liquid crystal display devices, and the like.

DESCRIPTION OF REFERENCE CHARACTERS 1 substrate
5 insulating film
10 thin-film transistor (TFT)
11 oxide semiconductor layer
11$s$ source region
11$sx$ low-resistance source region
11$d$ drain region
11$dx$ low-resistance drain region
11$c$ channel region
11$sa$ an end of the source region
11$da$ an end of the drain region
13 gate electrode
15 gate insulating film
16 interlayer insulating film
17 source electrode
18 drain electrode
17$c$, 18$c$ contact hole
19 protective film
100A semiconductor device
L1, L2 length
D1, D2 distance

The invention claimed is:

1. A semiconductor device, comprising:
a substrate; and
a thin-film transistor supported by the substrate,
wherein the thin-film transistor includes:
an oxide semiconductor layer that has a first channel region, and a source region and a drain region positioned on respective sides of the first channel region;
a gate insulating film, a source electrode, and a drain electrode formed above the oxide semiconductor layer; and
a first gate electrode that is formed above the gate insulating film and that is arranged so as to overlap the first channel region,
wherein the source region has a low-resistance source region that has a smaller resistance than the first channel region when a gate voltage is not being applied to the first gate electrode,
wherein the drain region has a low-resistance drain region that has a smaller resistance than the first channel region when a gate voltage is not being applied to the first gate electrode,
wherein the low-resistance source region connects to the source electrode, and the low-resistance drain region connects to the drain electrode,
wherein carrier concentrations of the low-resistance source region and the low-resistance drain region become progressively lower from a connecting portion of the source electrode and the low-resistance source region and a connecting portion of the drain electrode and the low-resistance drain region towards the first channel region,
wherein the thin-film transistor further includes:
a middle semiconductor region positioned between the source region and the drain region, and a second channel region positioned between the middle semiconductor region and the drain region, each formed in the oxide semiconductor layer;
a second gate electrode that is formed above the gate insulating film and that is arranged so as to overlap the second channel region; and
a middle electrode formed above the oxide semiconductor layer,
wherein the middle semiconductor region has a low-resistance middle region that has a smaller resistance than the first channel region and the second channel region when a gate voltage is not being applied to the first gate electrode and the second gate electrode,
wherein the low-resistance middle region connects to said middle electrode, and
wherein a carrier concentration of the low-resistance middle region becomes progressively lower from a connecting portion of the low-resistance middle region and the middle electrode towards the first channel region, and progressively lower from a connecting portion of the low-resistance middle region and the middle electrode towards the second channel region.

2. The semiconductor device according to claim 1,
wherein at least an end of the low-resistance source region or an end of the low-resistance middle region overlaps an end of the first gate electrode, or, at least an end of the low-resistance middle region or an end of the low-resistance drain region overlaps an end of the second gate electrode when viewed from a direction normal to the substrate.

3. The semiconductor device according to claim 1,
wherein at least a portion of the low-resistance source region or a portion of the low-resistance middle region overlaps the first gate electrode through the gate insulating film, or, at least a portion of the low-resistance drain region or a portion of the low-resistance middle region overlaps the second gate electrode through the gate insulating film when viewed from a direction normal to the substrate.

4. The semiconductor device according to claim 3,
wherein at least the portion of the low-resistance source region or the portion of the low-resistance middle region overlaps the first gate electrode through the gate insulating film, and, at least the portion of the low-resistance drain region or the portion of the low-resistance middle region overlaps the second gate electrode through the gate insulating film.

5. The semiconductor device according to claim 3,
wherein at least a distance from an end of the first gate electrode to an end of the low-resistance middle region or a distance from an end of the second gate electrode to an end of the low-resistance middle region is 0.2 μm to 2 μm.

6. The semiconductor device according to claim 1, wherein a carrier concentration of an end portion of the low-resistance middle region on the first channel region side and a carrier concentration of an end portion of the low-resistance middle region on the second channel region side are each $10^{18}$ cm$^{-3}$ to $10^{20}$ cm$^{-3}$.

7. The semiconductor device according to claim 1, wherein the middle electrode connects to the middle semiconductor region in a third contact hole formed in the gate insulating film, and
wherein a distance from the first gate electrode to the first contact hole, a distance from the first gate electrode to the third contact hole, a distance from the second gate electrode to the third contact hole, and a distance from the second gate electrode to the second contact hole are equal.

8. The semiconductor device according to claim 1, wherein at least one of the low-resistance source region, the low-resistance drain region, or the low-resistance middle region reaches a vicinity of a boundary of the oxide semiconductor layer on the substrate side.

9. The semiconductor device according to claim 1, wherein the oxide semiconductor layer includes an In—Ga—Zn—O semiconductor.

\* \* \* \* \*